United States Patent [19]

Ng et al.

[11] Patent Number: 5,438,703
[45] Date of Patent: Aug. 1, 1995

[54] RADIO WITH REDUCED FREQUENCY PULL

[75] Inventors: Christine S. K. Ng, Bayan Lepas; Eng M. Chong, Penang, both of Malaysia

[73] Assignee: Motorola, Inc., Schaumburg, Ill.

[21] Appl. No.: 165,759

[22] Filed: Dec. 9, 1993

Related U.S. Application Data

[63] Continuation of Ser. No. 793,965, Nov. 18, 1991, abandoned.

[51] Int. Cl.6 ............................................. H04B 1/40
[52] U.S. Cl. ..................................... 455/127; 455/76
[58] Field of Search ................ 455/75, 76, 126, 127, 455/343; 331/17

[56] References Cited

U.S. PATENT DOCUMENTS

| | | | |
|---|---|---|---|
| 4,752,748 | 6/1988 | Gryzeszykowski | 331/17 |
| 4,771,249 | 9/1988 | Burch et al. | 331/17 |
| 4,855,689 | 8/1989 | Kenkel | 331/17 |
| 4,885,553 | 12/1989 | Hietala et al. | 331/17 |
| 4,920,320 | 4/1990 | Matthews | 331/17 |
| 5,031,231 | 7/1991 | Miyazaki | 455/127 |
| 5,033,111 | 7/1991 | Marui | 455/127 |
| 5,068,625 | 11/1991 | Baker et al. | 331/17 |

*Primary Examiner*—Edward F. Urban
*Assistant Examiner*—Thanh Le
*Attorney, Agent, or Firm*—M. Mansour Ghomeshi

[57] ABSTRACT

A communication device (300) having a synthesizer (304) for synthesizing a radio frequency signal. The synthesizer (304) includes a first and a second mode of operation with the first mode having a wider bandwidth loop than the second mode. An amplifier (316) is included for amplifying the radio frequency signal of the output of the synthesizer (304). The amplifier (316) is turned on during the first mode of operation of the synthesizer (304) for minimizing the frequency pull of the radio frequency signal.

14 Claims, 4 Drawing Sheets

RADIO WITH REDUCED FREQUENCY PULL

This is a continuation of application Ser. No. 07/739,965, filed on Nov. 18, 1991, now abandoned.

TECHNICAL FIELD

This invention relates generally to transmitters and more particularly to a transmitter having a synthesizer.

BACKGROUND

Synthesizers are commonly used in radio communication devices to generate the carder signal having a desired frequency. In general and referring to FIG. 1, a communication device 100 includes a synthesizer 104 coupled to an oscillator 102. The synthesizer 104 produces a signal having a frequency determined by a controller 112. The output of the synthesizer 104 having a desired frequency is coupled to a buffer 106 and then applied to an amplifier 108 where it is amplified and transmitted via an antenna 110. In general, synthesizers operate in two distinct modes of operation. A first, adapt mode where the synthesizer has a wide loop bandwidth filter. This mode of operation utilizes a wide bandwidth to rapidly allow the synthesizer to settle on a desired frequency. Once the frequency has been reached, the synthesizer switches to a normal mode of operation which utilizes a narrow bandwidth filter to eliminate more of the undesired spurs. This second mode is the operating mode of the communication device 100.

Referring now to FIG. 2, a timing diagram of the operation of the synthesizer 104 in conjunction with the amplifier 108 is shown. The timing diagram shows the occurrence of several synchronous events. These events include synthesizer chip enable (CE), frequency pull, and transmit enable. The X axis represents time. With frequency information available on the data line 113 and the CE line active, the synthesizer 104 proceeds to produce a signal at its output. The frequency of this signal is pulled by an amount shown by waveform 204 in the adapt mode, which is the mode that the synthesizer initially attempts to produce the signal and lock to a desired frequency. It can be further seen by segment 206 that as the operation mode changes from adapt to normal, a small pull is again experienced. The transition of the amplifier 108 from the OFF state to the ON state occurs in the normal mode of operation, as shown by transient 212. When the transmit line goes high the amplifier 108 turns ON, generating a substantial pull 208 in the output frequency. This is a significant problem because this oscillation 208 will be transmitted as the amplifier 108 transmits all signals applied to its input. Normally, The frequency pull 208 will have an amplitude as high as 20 db from the base and a frequency pull of 200 Khz. Such frequency pull is a significant burden on communication devices having low frequency separation. It can be appreciated that such a substantial frequency drift causes disturbances in the adjacent channels, a remedy for which is highly desirable.

In the past, reverse isolation buffers have been used between the synthesizer and the transmitter chain to minimize these disturbances. These buffers generally demand high reverse isolation which is realized with high component counts. These buffers help in the alleviation of the frequency pull problem, however, they add cost to the overall cost of the product and require more volume of the available space in the communication device. A significant problem with these buffers is their layout requirements. Due to their sensitive operating environments such buffers must be carefully matched with stages to which they are coupled. Such matching requires careful layouts which may take several optimization iterations, further increasing product cost. With ever increasing demand in cost and size reductions, it is clear that a more substantial remedy to the frequency pull in a communication device is desired.

SUMMARY OF THE INVENTION

A communication device having a synthesizer means for synthesizing a radio frequency signal is provided. The synthesizer means includes a first mode and a second mode of operation with the first mode having a wider bandwidth loop than the second mode. The communication device also includes an amplifier which is coupled to the synthesizer means for amplifying the radio frequency signal of the output of the synthesizer. The amplifier is turned on during the first mode of operation of the synthesizer for minimizing the frequency pull of the radio frequency signal. In other aspects of the present invention, a method is disclosed in a transmitter having a synthesizer and an amplifier. The method includes the steps of generating the radio frequency signal, locking the synthesizer to the radio frequency signal, and finally turning the amplifier ON in the adapt mode to minimize the frequency pull of the radio frequency signal.

DETAILED DESCRIPTION OF THE PREFERRED EMBODIMENT

Communication devices using synthesizers as their carrier frequency generators suffer from a problem called frequency pull. Each transmission is preceded by the synthesizer locking to a desired frequency. When the transmitter is turned ON, this locked frequency is pulled in one or another direction. The amount of the frequency pull depends on the reverse reflection that travels from the transmitter back to the synthesizer. This problem causes frequency stability beyond allowable levels which is highly undesirable. It is well known that synthesizers operate in two modes of operation, the first mode, adapt mode is used to rapidly secure the VCO to a desired frequency. The loop filter bandwidth is wide in this mode so as to allow rapid stabilization. The second mode of operation, normal mode is used when the VCO has locked to the desired frequency. Common synthesizer designs turn the transmitter ON in the normal mode of operation when the frequency of the synthesizer (VCO) is locked and the loop filter has switched to narrow bandwidth. This invention provides a method of turning the transmitter ON so as not to significantly affect the operating frequency of the synthesizer.

Figure 1:
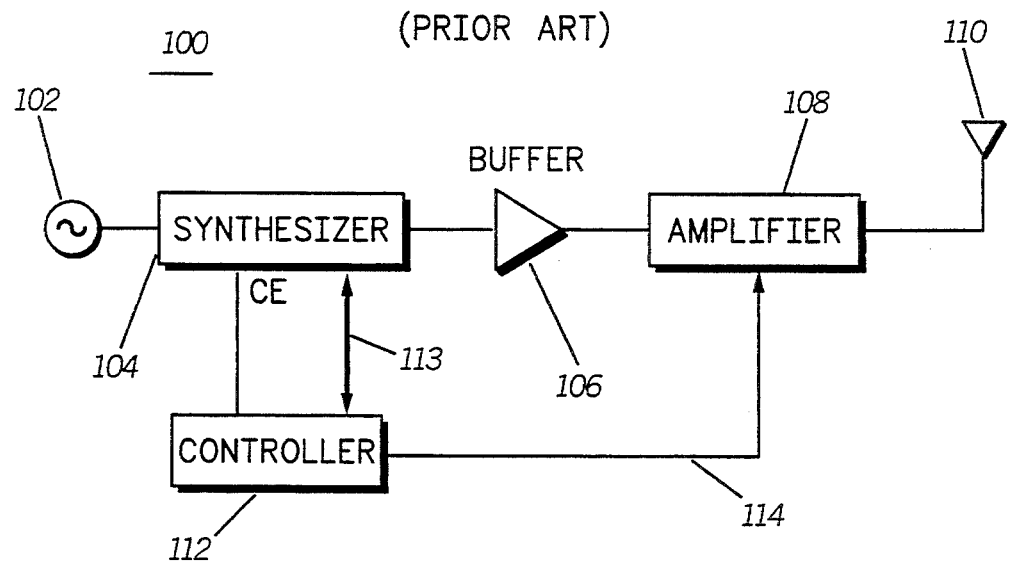
FIG. 1 shows a block diagram of a presently available communication device.
Figure 2:
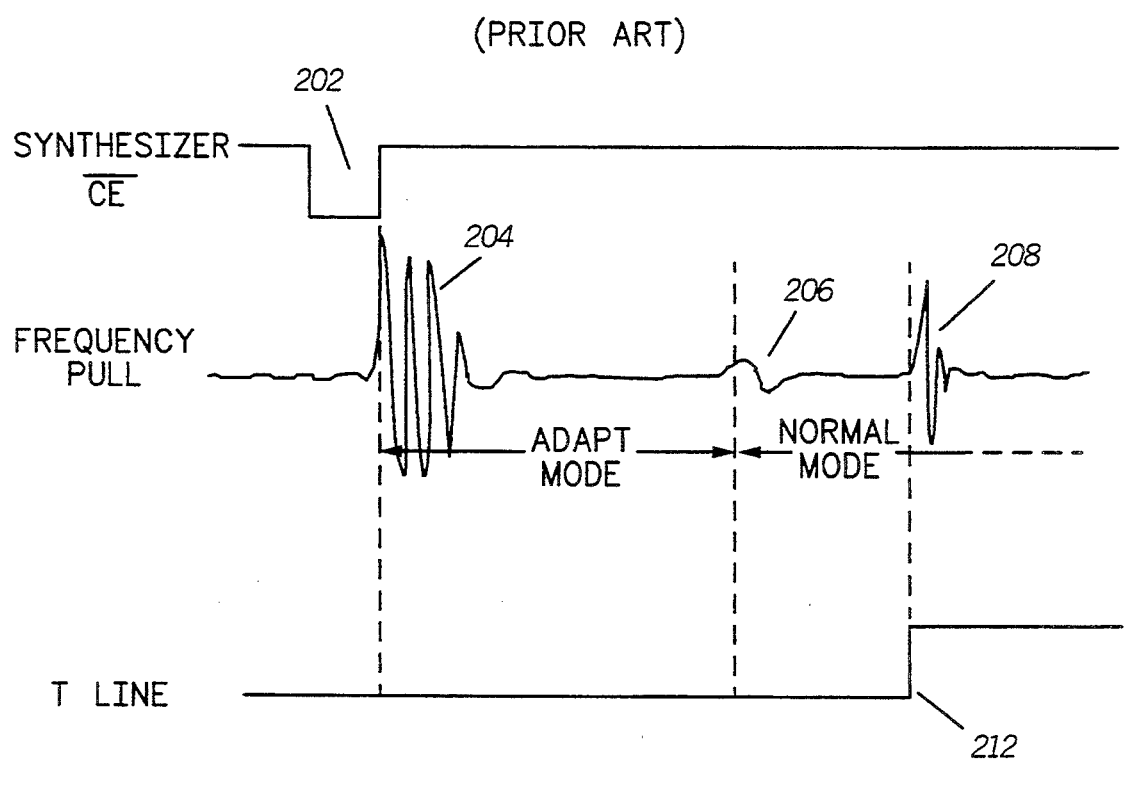
FIG. 2 shows timing diagram of the operation of the elements of the communication device of FIG. 1.
Figure 3:
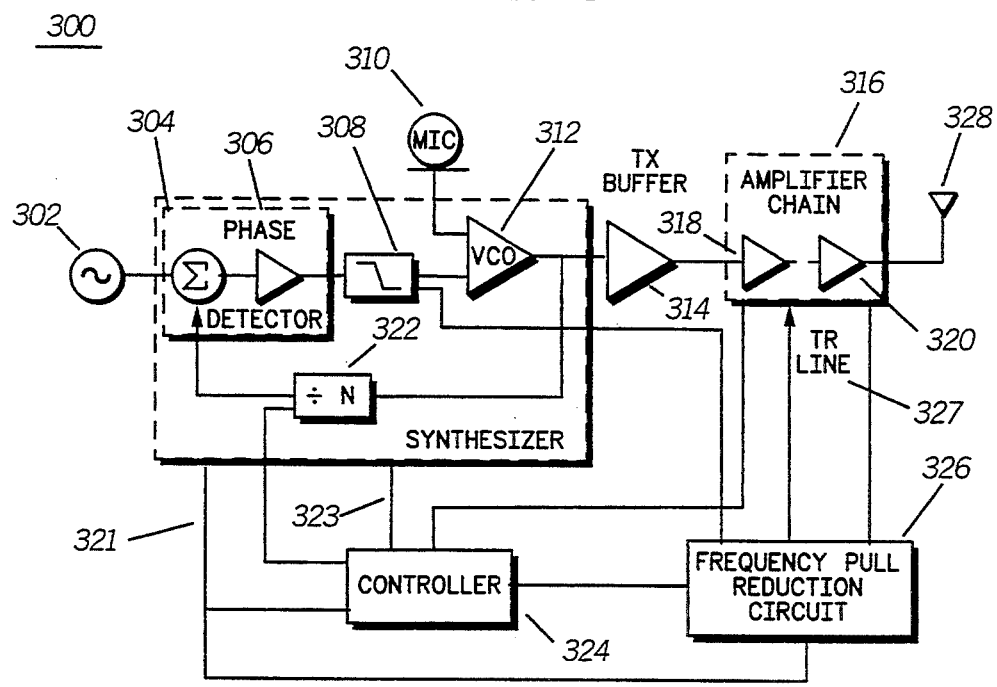
FIG. 3 shows a block diagram of a communication device in accordance with the principles of the present invention.

Referring now to FIG. 3, a block diagram of a communication device 300 is shown in accordance with the principles of the present invention. The communication device 300 comprises a transmitter or a transceiver. An amplifier block 316 is coupled to a synthesizer block 304 via a transmit buffer 314. The operation of the synthesizer 304 and indeed of the entire communication device 300 is controlled by a controller 324. The synthesizer 304 is fed by a reference oscillator 302. The synthesizer 304 includes a phase detector 306 coupled to a VCO 312 via a loop filter 308. The output of the VCO 312 is fed back to the phase detector 306 via a loop divider 322. Synthesizers are well known in the art and their operations are well understood. In general, by changing the value of the divisor N in the divider 322, the operating frequency of the VCO 312 may be changed. The value of the divisor N is varied under the commands of the controller 324. The signal generated by the VCO 312 is the carrier signal for the communication device 300. Modulation of this carrier signal is provided via an audio signal from a microphone 310 or any other source.

The controller 324 besides controlling the divisor N, and hence the frequency of the VCO 312, provides the synthesizer 304 with a chip enable (CE) signal to the synthesizer 304 via line 321. The CE signal informs the synthesizer 304 when to proceed with the generation of the desired signal. When the CE line 321 is activated, the loop filter 308 assumes a wide bandwidth causing the synthesizer 306 to operate in the adapt mode. In this mode, the VCO 312 rapidly settles to the desired frequency, slightly compromising the suppression of the undesired noise elements for speed. This mode is intentionally utilized to secure a fast lock for the VCO 312. Once the desired frequency is reached, the controller 324 commands the transition to the normal mode of operation. In this mode, the loop filter 308 assumes a narrow bandwidth in order to remove more of the undesired spurs which may be present in the synthesizer loop. A transmit buffer 314 couples the signal at the output of the VCO 312 to the amplifier chain 316. Included in the amplifier chain 316 is a preamplifier 318 and a power amplifier 320. The output of the power amplifier 320 is coupled to an antenna 328 via which radio frequency signals generated by the VCO 312 are transmitted.

The controller 324 controls the timing of the amplifier chain 316 and the synthesizer 304. In accordance with the principles of the present invention, when the synthesizer 304 is in the adapt mode and after the lock conditions of the synthesizer have been declared, the controller 324 turns the amplifier 316 ON. It has been observed that when the transmitter 316 is turned on in the adapt mode the frequency pull is significantly lower than when turned on in the normal mode. This is shown in the timing diagram of FIG. 4. The timing operation of the communication device 300 is controlled by a frequency pull reduction circuit 326 which is coupled to the controller 324, the amplifier 316 and the synthesizer 304. In general, the circuitry 326 monitors the state of the synthesizer 304 and the amplifier 316 and directs them to turn ON and OFF at appropriate periods of time.

Figure 4:
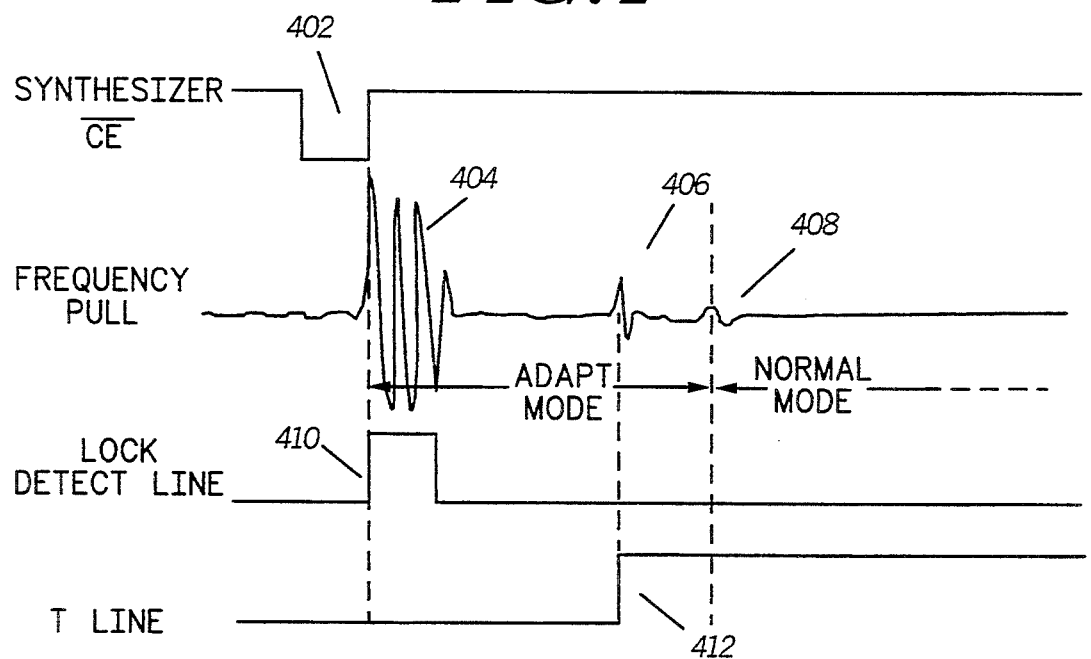
FIG. 4 shows a timing diagram of the general operation of the elements of the communication device of FIG. 3.

Referring to FIG. 4, a general timing diagram of the operation of the communication device 300 is presented. The activity on the synthesizer CE line 321 is indicated by the transition 402. The frequency pull of the synthesizer 304, the lock detect, and the amplifier turn on are shown in the subsequent time lines. Reviewing the frequency pull line, frequency pull occurs at several points. The first occurs when the synthesizer 304 is turned on, as shown by 404. This frequency pull 404 represents the initial settling of the synthesizer 304 and is expected. No performance compromises are necessary for this pull 404 is internal and occurs before the amplifier 316 is turned on. The assertion of the synthesizer lock detect line 323, as shown by the transition 410, indicates to the controller 324 that the output signal of the VCO 312 is ready for transmission. At that point, the transmit line is pulled high, (412), while the synthesizer 304 is still in the adapt mode. It can be seen that a significant reduction in the frequency pull 406, as compared to frequency pull 208, is experienced. Specifically and without further optimization, the frequency pull 406 observed when the amplifier 316 is turned on in the adapt mode of the synthesizer 304 is limited to 30 to 50 KHz. This is obviously a significant improvement over the experienced 200 to 300 KHz pull observed in presently available schemes. Shortly after the transmit line 327 changes to the active state and the synthesizer 304 has been adequately stabilized, the mode of the synthesizer 304 changes, normally producing a slight disturbance 408. This disturbance is no more than a couple of KHz which is not significant at all to the operation of the device 300.

Figure 5:
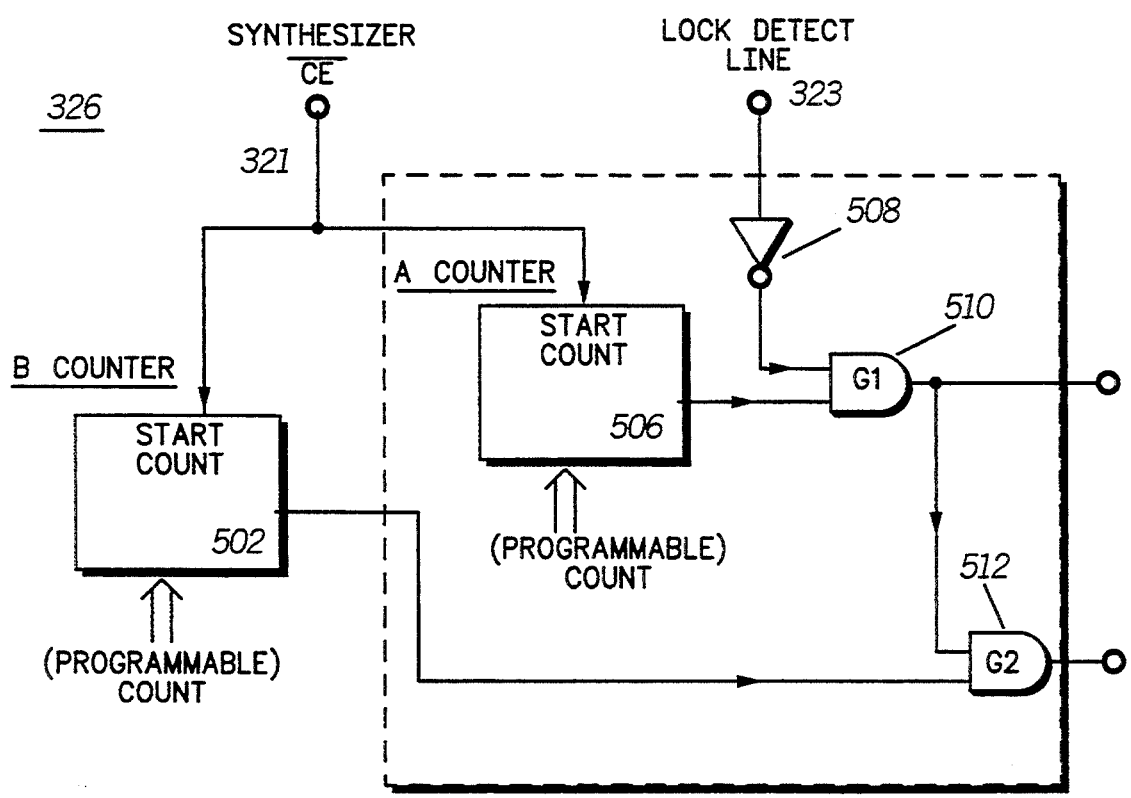
FIG. 5 shows a block diagram of the elements of a frequency pull reduction circuit in accordance with the principles of the present invention.

Referring now to FIG. 5, a block diagram of the elements of the frequency pull reduction circuit 326 in accordance with the principles of the present invention is shown. The circuit 326 includes a first counter 502, a second counter 506, and a logic circuit including an inverter 508 and two AND gates 510 and 512. The counters 502 and 506 are programmable counters whose operations are controlled by the controller 324. The synthesizer 304 starts both counters 502 and 506 via the chip enable line 321. The counter 502 is dedicated to controlling the length of the adapt mode operation while counter 506 controls the time to monitor synthesizer lock detect line 323. The output of the counter 502 is coupled to the reset line of counter 506 and the second input of the AND gate 512. The frequency pull reduction circuit 326 is adapted to control the timing of the modes of operation of the synthesizer 304.

Figure 6:
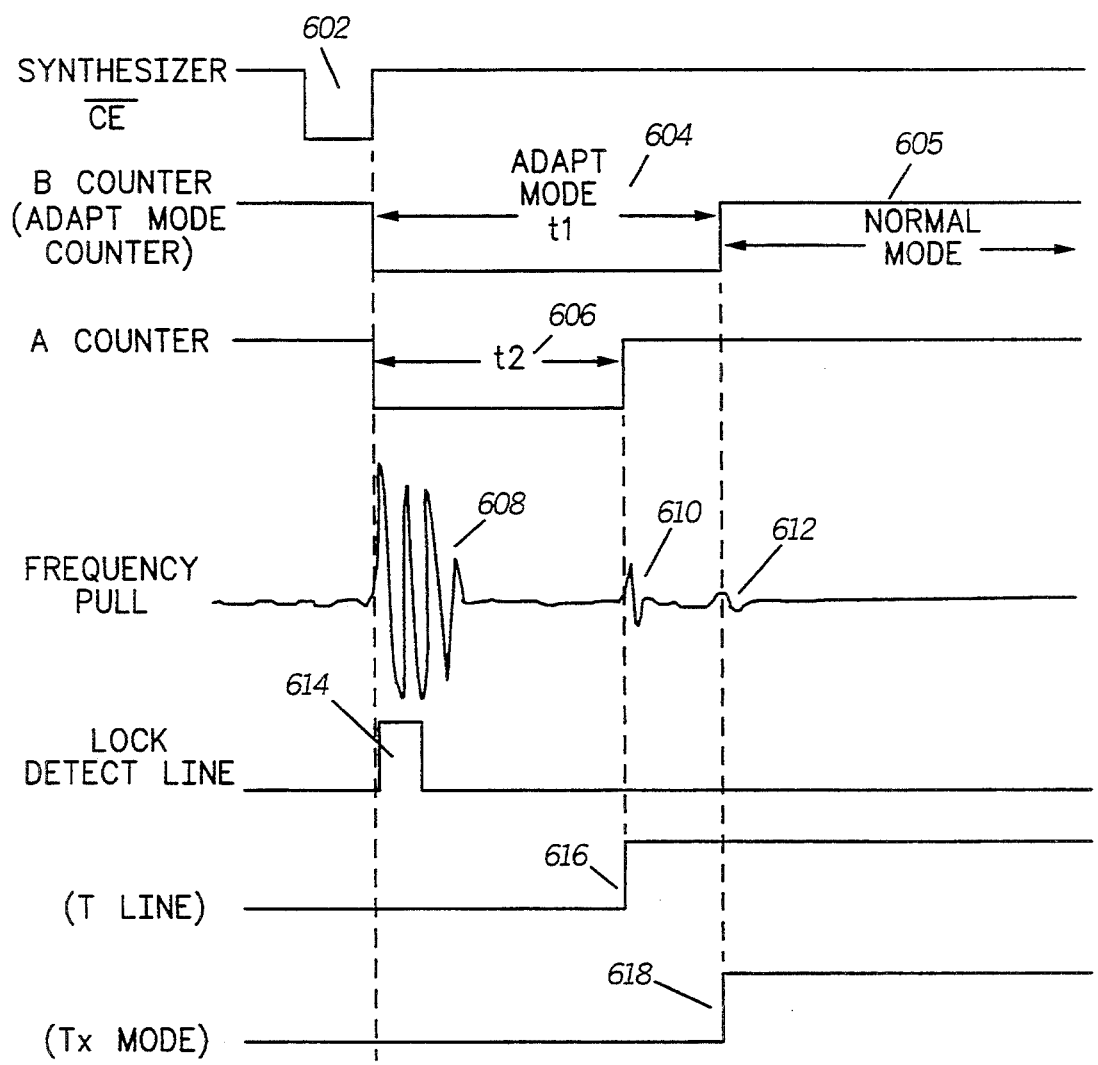
FIG. 6 shows a detailed timing diagram of the operation of the communication device of FIG. 3.

Referring to FIG. 6, a more detailed timing diagram, including the participation of the elements of the frequency pull reduction circuit 326, is shown. Once again, the synthesizer chip enable 602 indicates the beginning of a series of events. The active state or transition of the chip enable line 321 sets the synthesizer 304 in the adapt mode and starts the counter 502. In fact, the counter 502 is programmed to keep track of the adapt mode of the synthesizer 304. The counter 506 is also turned on with the chip enable transition 602. This counter 506, however, tracks the stabilization period 606 of the synthesizer 304. A transition at the output of the counter 506 indicates that the signal of the VCO 312 is stable and in condition for amplification and transmission. The period 606 is calculated to assure that the frequency of the synthesizer 304 is stabilized. Indeed, the period 606 need only encompass the lock detect period 614, since it is the lock detect line 323 that reports the stabilization of the synthesizer 304 to the controller 324, and hence the circuit 326.

The output of the counter 506 is coupled to the second input of the AND gate 510. Coupled to the first input of the AND gate 510 is the lock detect line 323 inverted via an inverter 508. The output of the AND gate 510 is coupled to the transmit line 327, hence controlling the state of the amplifier 316. With the lock detect line low and the output of the counter 506 high, the transmit line 327 is switched high, directing the amplifier 316 to turn on. The frequency pull 610 is experienced at turn on, which as explained earlier, is significantly lower than those experienced with methods of the prior art.

The output of the AND gate 510 is also coupled to the first input of the AND gate 512. Along with its second input arriving from the counter 502, the AND gate 512 detects the end of the adapt mode. The end of the adapt mode coupled with the active state of the transmit line 616 produces a high 618 at the output of the AND gate 512 which directs the synthesizer 304 to switch to the normal mode of operation 605.

In general, after T2 seconds, the counter 506 changes state indicating that the output signal of the VCO 312 is stable. As a further assurance, this signal is ANDed with the lock detect line 323 to produce the transition 616 at the output of the AND gate 510, thus indicating a locked system. The high output of the gate 510 is used to turn the amplifier 316 on. T1, on the other hand, denotes the duration of the adapt mode. The counters 502 and 506 are programmed such that the output of the AND gate 510 switches to the active state only when the synthesizer 304 is in the adapt mode. This is accomplished by forcing T2 to always be smaller than T1 by forcing the counter 502 to have higher counts than the counter 506. The end of the adapt mode is indicated by the transition of the output of the counter 502. This output of the counter 502 is coupled to the gate 512 to insure that the transmit line 327 is not asserted in case the system is not locked by the end of the adapt mode. In the event that such occurs, the output of gate 512 produces a low which will indicate to the controller 324 that the system did not lock during the adapt mode. This condition is impermissible and is followed by the controller 324 reprogramming the system.

In summary, a communication device using a synthesizer as its means of producing a radio frequency signal is described. In normal operation, the synthesizer assumes an adapt mode where stabilization of the output frequency takes place. The adapt mode is characterized by wide bandwidth loop filters so that the frequency may stabilize at a faster rate. The power amplifier of the communication device is coupled to the synthesizer and are turned ON after the synthesizer has stabilized. In the present invention, the transmitter is turned on during the adapt mode when the loop filter is still wide lowering the loading effects the amplifier has on the frequency output of the synthesizer. By not turning the transmitter ON during the normal mode of operation, a significant reduction in the frequency pull of the signal is achieved. A significant advantage of the present invention is that the frequency pull of the transmitter is significantly reduced and a faster lock time is achieved. Furthermore, the need to carefully evaluate ground connections is eliminated. This results in considerable cost savings for tedious and expensive reiterations of the synthesizer implementation are no longer necessary.

What is claimed is:

1. In a transmitter having a synthesizer for generating a radio frequency signal and an amplifier for amplifying the radio frequency signal, the synthesizer having a frequency pull and a normal mode of operation, a method for minimizing frequency pull of the radio frequency signal when the amplifier is turned on, comprising the steps of:
    generating the radio frequency signal in an adapt mode which mode having a wider loop filter bandwidth than the normal mode of operation;
    locking the synthesizer to the radio frequency signal in the adapt mode;
    utilizing a timer for allowing a desired time to elapse;
    turning the amplifier on in the adapt mode to allow the wider loop filter bandwidth to lower the loading effect to the amplifier on the synthesizer in order to minimize the frequency pull of the radio frequency signal; and switching the synthesizer to the normal mode of operation.

2. The method of claim 1, further including the step of timing the occurrence of events to insure that the amplifier is not turned on in the normal mode of operation.

3. A transmitter, comprising:
    synthesized means for synthesizing a radio frequency signal, the synthesizer means having a first mode and a second mode of operation and a frequency pull, the first mode having a wider operating bandwidth than the second modes;
    an amplifier coupled to the synthesizer means for amplifying the radio frequency signal means for turning includes a timer to allow a desired time to elapse before turning the amplifier on;
    means for turning the amplifier on in the first mode for minimizing the frequency pull of the radio frequency signal; and
    means for switching the synthesizer means to the second mode of operation.

4. The transmitter of claim 3, further including means for detecting when the synthesizer means is locked.

5. The transmitter of claim 3, wherein the synthesizer means includes a Voltage Controlled Oscillator (VCO).

6. The transmitter of claim 3, wherein the amplifier comprises a power amplifier.

7. A communication device, comprising:
    a transmitter for transmitting a radio frequency signal, the transmitter including:
        synthesizer means for synthesizing the radio frequency signal, the synthesizer means having a first mode and a second mode of operation, and a frequency pull the first mode having a wider bandwidth loop filter than the second mode;
        an amplifier coupled to the synthesizer means for amplifying the radio frequency signal;
        means for turning the amplifier on in the first mode to allow the wider loop filter bandwidth to lower the loading effect of the amplifier on the synthesizer means in order to minimized the frequency pull of the radio frequency signal the means for turning includes a timer to allow a desired time elapse before turning the amplifier on; and
        means for switching the synthesizer means to the second mode of operation.

8. The communication device of claim 7, wherein the transmitter further includes means for detecting when the synthesizer means is locked.

9. The communication device of claim 7, wherein the first mode of the synthesizer means includes an adapt mode.

10. The communication device of claim 7, wherein the second mode of the synthesizer means include a normal mode.

11. The communication device of claim 7, wherein the means for turning the amplifier on includes a control logic circuit.

12. The communication device of claim 11, wherein the control logic circuit includes at least one counter.

13. A transmitter, comprising:
  a synthesizer for synthesizing a radio frequency signal, the synthesizer including:
    a loop filter having a switchable wide and narrow bandwidth;
    an adapt mode operating with the wide bandwidth of the loop filter;
    a normal mode operating with the narrow bandwidth of the loop filter;
  an amplifier coupled to the synthesizer means for amplifying the radio frequency signal;
  means for turning the amplifier on the adapt mode to allow the wide bandwidth to minimize the shift in the frequency of the radio frequency signal, the means for turning includes a timer to allow a desired time elapse before turning the amplifier on; and
  means for switching the synthesizer to the normal mode of operation.

14. The transmitter of claim 13, further including means for detecting when the synthesizer means is locked.

* * * * *

UNITED STATES PATENT AND TRADEMARK OFFICE
CERTIFICATE OF CORRECTION

PATENT NO. : 5,438,703
DATED : August 1, 1995
INVENTOR(S) : Ng, et al.

It is certified that error appears in the above-indentified patent and that said Letters Patent is hereby corrected as shown below:

Column 6, claim 3, line 26, delete "synthesized" and insert therefor --synthesizer--.

Column 6, claim 3, line 30, delete "modes" and insert therefor --mode--

Column 6, claim 3, line 59, delete "minimized" and insert therefor --minimize--

Column 8, claim 13, line 7, after "on" and before "the" insert --in--.

Signed and Sealed this

Fifth Day of December, 1995

Attest:

BRUCE LEHMAN

*Attesting Officer*  *Commissioner of Patents and Trademarks*